United States Patent [19]
Nakao et al.

[11] Patent Number: 5,835,038
[45] Date of Patent: Nov. 10, 1998

[54] DC DITHER CIRCUITRY AND METHOD FOR DELTA-SIGMA MODULATOR

[75] Inventors: Shigetoshi Nakao, Komae; Hideki Kanayama, Atsugi; Toshio Murota, Hiratsuka; Masayuki Ukawa, Sagamihara, all of Japan

[73] Assignee: Burr-Brown Corporation, Tucson, Ariz.

[21] Appl. No.: 853,170

[22] Filed: May 8, 1997

[51] Int. Cl.$^6$ .................................................. H03M 1/10
[52] U.S. Cl. ........................................ 341/131; 341/118
[58] Field of Search .................................. 341/118, 131, 341/143

[56] References Cited

U.S. PATENT DOCUMENTS

| | | | |
|---|---|---|---|
| 4,509,037 | 4/1985 | Harris | 340/347 |
| 4,855,745 | 8/1989 | Smither | 341/156 |
| 4,916,449 | 4/1990 | Kubo et al. | 341/131 |
| 5,057,840 | 10/1991 | Ledzius et al. | 341/144 |
| 5,144,308 | 9/1992 | Norsworthy | 341/131 |
| 5,200,750 | 4/1993 | Fushiki et al. | 341/143 |
| 5,357,252 | 10/1994 | Ledzius et al. | 341/143 |
| 5,408,233 | 4/1995 | Gannon et al. | 341/131 |
| 5,416,481 | 5/1995 | Chen | 341/131 |
| 5,424,739 | 6/1995 | Norsworthy et al. | 341/143 |
| 5,483,238 | 1/1996 | Norsworthy | 341/131 |
| 5,530,442 | 6/1996 | Norsworthy et al. | 341/131 |
| 5,561,424 | 10/1996 | Norsworthy et al. | 341/126 |

*Primary Examiner*—Howard L. Williams
*Attorney, Agent, or Firm*—Cahill, Sutton & Thomas P.L.C.

[57] ABSTRACT

A characteristic tone in a delta-sigma analog-to-digital converter is shifted out of an audible pass band without diminishing dynamic range or signal-to-noise ratio thereof by operating the digital-to-analog converter to measure its offset voltage. If the amplitude of the measured offset voltage exceeds a predetermined value, no dither signal is applied to the input of the delta-sigma modulator. If the measured offset voltage is less than the predetermined value, a positive DC dither voltage is added to the input voltage of the delta-sigma modulator if the measured offset voltage is positive, or is subtracted if the measured offset voltage is negative.

12 Claims, 4 Drawing Sheets

DC DITHER CIRCUITRY AND METHOD FOR DELTA-SIGMA MODULATOR

BACKGROUND OF THE INVENTION

The invention relates to a circuit and method for minimizing power dissipation associated with use of dither techniques to shift a characteristic low frequency tone of a delta-sigma analog-to-digital converter out of an audible pass band.

Delta-sigma modulators and analog-to-digital converters incorporating delta-sigma modulators are well known. It also is well known that a delta-sigma modulator generates a characteristic "tone" which can be thought of as a low frequency "envelope" signal of the serial stream of digital pulses produced by the delta-sigma modulator. The frequency and power level of the tone depend mainly on the architecture or circuit configuration of the delta-sigma modulator, especially the order and the integrator coefficient of the delta-sigma modulator, and on the nonlinearity of the circuitry. (Those skilled in the art know that a delta-sigma modulator is a filter circuit, and that the characteristics of a filter circuit including a number of integrators is defined by an equation with a number of coefficients related to the order of the filter, and that the modulation characteristics of a delta-sigma modulator are defined by such coefficients.) The tone of a delta-sigma modulator typically is in the audible frequency range of 20 hertz to 20 kilohertz, and has the effect of causing deterioration of the analog performance of a delta-sigma analog-to-digital converter, for example by reducing the dynamic range and/or signal-to-noise ratio thereof. In audio applications the tone of a delta-sigma analog-to-digital converter may be manifested as an annoying audio frequency "hum".

It is well known that the tone frequency of a delta-sigma modulator can be shifted out of the audible 20 kilohertz band, i.e., out of the pass band, by adding a "dither" signal to the analog input signal applied to the delta-sigma modulator. U.S. Pat. No. 5,416,481 (Chen), U.S. Pat. No. 5,530,442 (Norsworthy et al.), U.S. Pat. No. 5,483,238 (Norsworthy), U.S. Pat. No. 4,855,745 (Smither), U.S. Pat. No. 5,144,308 (Norsworthy), and U.S. Pat. No. 5,408,233 (Gannon et al.), are generally indicative of the state of the art in using pulses of constant frequency and amplitude as dither signals for this purpose. It also is known that quantization noise of a delta-sigma modulator is highly dependent on offset voltage and DC bias.

However, the known techniques of adding AC dither to shift tones and of the audible pass band result in substantial additional undesirable "dither power". Although the integrator coefficient of a delta-sigma modulator can be optimized to reduce the power level of the tone of a delta-sigma modulator, it is difficult to reduce the power associated with the above known dither technique, especially in delta-sigma modulators designed for high-precision applications.

It would be desirable to minimize the dither level applied to a delta-sigma modulator because as the dither level increases, the analog input voltage range must be reduced correspondingly in order to avoid oscillation of the delta-sigma modulator loop because the effective input signal is the sum of the applied analog input signal plus the dither signal level. Such reduction of the analog input signal reduces the signal-to-noise ratio of the circuit.

It would be desirable to provide a technique for shifting the characteristic tone frequency of a delta-sigma modulator outside of the pass band without increasing the power as much as is required using known dither circuitry and techniques.

SUMMARY OF THE INVENTION

Accordingly, it is an object of the invention to provide a dither circuit and a dither technique to shift a characteristic tone frequency of a delta-sigma modulator out of the audible pass band without requiring as much additional power dissipation as would be required using the closest prior dither circuitry and techniques.

It is another object of the invention to minimize the amount of dither required to shift the tone of a delta-sigma analog-to-digital converter out of the audible pass band.

It is another object of the invention to provide a delta-sigma analog-to-digital converter having a minimum audible tone and also having good dynamic range.

It is another object of the invention to provide a delta-sigma analog-to-digital converter having a minimum audible tone and also having good signal-to-noise ratio.

Briefly described, and in accordance with one embodiment thereof, the invention provides a method and circuit for minimizing effects of a characteristic tone in a delta-sigma analog-to-digital converter without substantially diminishing the dynamic range or signal-to-noise ratio thereof, by coupling an analog input (2A) of the delta-sigma modulator to a first reference voltage (GND) and also coupling a dither input of the delta-sigma modulator to the first reference voltage, operating the delta-sigma modulator and the decimation filter to produce a digital offset code (DZERO) representing a total offset voltage associated with the delta-sigma modulator, causing the dither signal to be a first DC voltage ($+V_{DCDITHER}$) if the digital offset code is positive with respect to the first reference voltage and is of a magnitude less than a predetermined magnitude (DCDITHER), a second DC voltage ($-V_{DCDITHER}$) if the digital offset code is negative with respect to the first reference voltage and is of a magnitude less than the predetermined magnitude, or the first reference voltage (GND) if the magnitude of the digital offset code is greater than the predetermined magnitude (DCDITHER). The analog input of the delta-sigma modulator then is coupled to an analog input voltage ($V_{in}$) and the delta-sigma analog-to-digital converter is operated to produce a corresponding digital output signal.

DETAILED DESCRIPTION OF THE PREFERRED EMBODIMENTS

Figure 1:
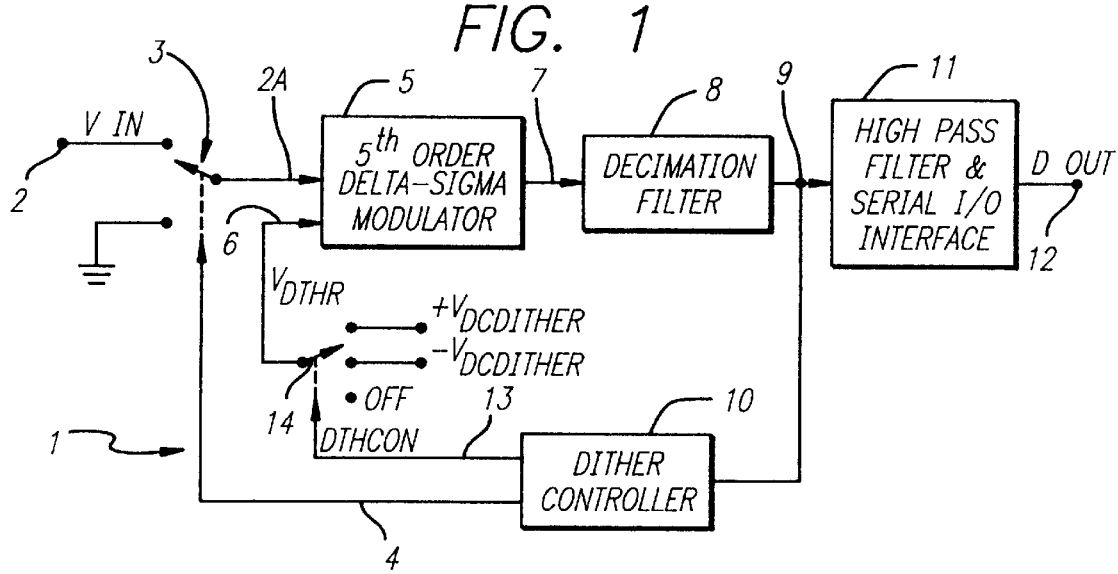
FIG. 1 is a block diagram of the delta-sigma analog-to-digital converter of the invention.

Referring to FIG. 1, delta-sigma analog-to-digital converter 1 includes a fifth-order delta-sigma modulator 5 having an analog input 2A coupled to one terminal of an initialization switch 3 that is controlled by an initialization signal on conductor 4 to connect analog input 2A either to ground during an initialization procedure or to analog input conductor 2 conducting an analog input signal $V_{in}$ during a conversion procedure. Fifth-order digital-to-analog modulator 5 also includes a "DC dither signal" input conductor 6 connected to one terminal of a dither switch 14 that is controlled by a dither switch control signal conductor 13 that causes dither switch 14 to connect dither signal conductor 6 to one of ground, $+V_{DCDITHER}$, or $-V_{DCDITHER}$. Typical values of $V_{DCDITHER}$ would be in the range of 1.6% to 1.8% of the peak-to-peak analog input voltage $V_{in}$.

Fifth-order delta-sigma modulator 5 produces a serial stream of pulses on conductor 7 and applies them to the input of a decimation filter 8. Decimation filter 8 produces a serial digital data stream which accurately represents the analog input signal $V_{in}$. The digital data stream on conductor 9 is applied as an input both to a high pass filter and serial I/O (input/output) interface circuit in block 11 and also as an input to dither controller 10. Dither controller 10 produces the dither switch control signal on conductor 13 and the initialization signal on conductor 4. The serial I/O interface circuit in block 11 produces a serial digital output signal DOUT on output conductor 12.

Figure 2:
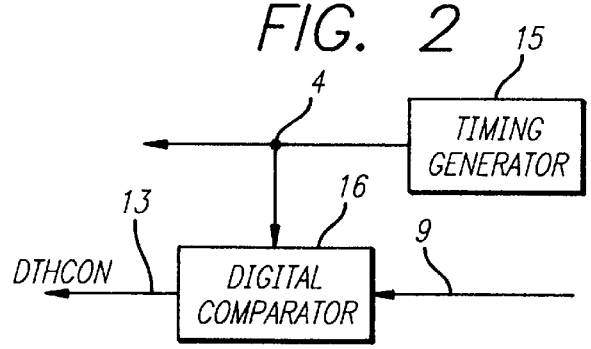
FIG. 2 is a block diagram of the dither controller of the analog-to-digital converter of FIG. 1.

Referring to FIG. 2, dither controller 10 includes a conventional digital comparator 16 which receives the output of decimation filter 8 from conductor 9. Digital comparator 16 also receives the initialization signal on conductor 4, which is produced by a clock generator 15 that produces the timing signal for delta-sigma analog-to-digital converter 1.

Figure 4:
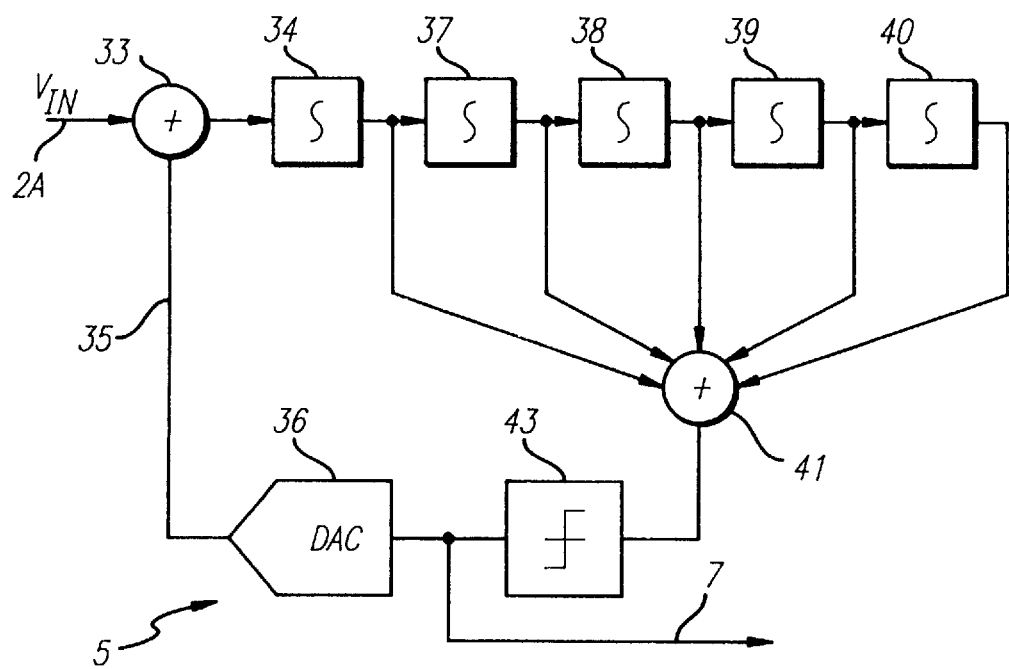
FIG. 4 is a detailed block diagram of the fifth-order delta-sigma modulator included in the analog-to-digital converter of FIG. 1.

Referring to FIG. 4, fifth-order delta-sigma modulator 5 includes an analog summer 33 which receives the analog input signal $V_{in}$ from conductor 2A, and also receives a one-bit analog signal on conductor 35 from a one-bit digital-to-analog converter 36. The output of analog summer 33 is applied to the input of a first integrator 34. The output of integrator 34 is applied to the input of a second integrator 37 and to one input of an analog summer 41. The output of integrator 37 is applied to the input of a third integrator 38 and to another input of analog summer 41. The output of integrator 37 is applied to the input of a fourth integrator 39 and to a third input of analog summer 41. The output of integrator 39 is applied to the input of a fifth integrator 40 and to a fourth input of analog summer 41. The output of integrator 40 is applied by conductor 7 to a fifth input of analog summer 41. The output of analog summer 41 is applied to a quantizer or comparator 43, the output of which is applied by conductor 7 to the input of one-bit digital-to-analog converter 36.

The delta-sigma modulator of FIG. 1 operates by first closing the initialization switch 3 to set the input 2A of fifth-order delta-sigma modulator 5 to ground. This causes delta-sigma analog-to-digital converter 1 to generate a digital output that represents the total or "composite" process-caused analog offset voltage of the input stage buffer amplifier 45 (FIG. 5) and fifth-order delta-sigma modulator circuitry in block 5, which is expressed as a digital code DZERO. The composite offset voltage is, of course, designed to be as small as possible, and by suitable layout techniques, can be reduced to below ±0.6% of the full scale peak-to-peak value of the analog input voltage $V_{in}$, but may have a worst case value of about ±2% of the full-scale peak-to-peak value of $V_{in}$ due to manufacturing control fluctuation.

The measured digital offset code DZERO is applied as an input to the dither controller 10, which is shown in FIG. 2.

Figure 3A:
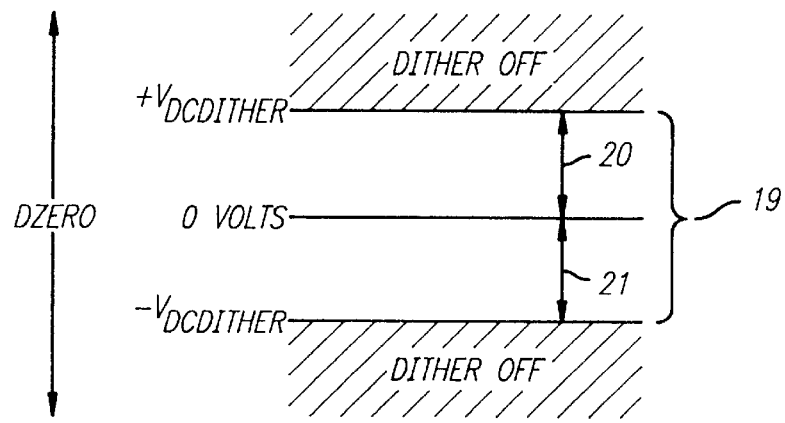
FIG. 3A is a diagram useful in explaining the dither controller of FIG. 2.

Dither controller 10 then generates a dither control signal DTHCON on conductor 13 to control dither switch 14 in accordance with the diagram of FIG. 3A. That is, if the magnitude of DZERO is larger than a predetermined digital number DCDITHER, dither switch 14 connects dither signal conductor 6 to ground. DCDITHER is a digital representation of the magnitude of threshold voltages $+V_{DCDITHER}$ or $-V_{DCDITHER}$, which have the predetermined minimum magnitude of the dither signal $V_{DTR}$ required on conductor 6 to shift the characteristic tone frequency out of the 20 hertz to 20 kHz pass band.

More specifically, FIG. 3A shows how dither controller 10 produces the digital dither switch control signal DCON on conductor 13 to operate dither switch 14 conductor 6 to ground if the magnitude of a digital offset level code DZERO during the calibration interval 25 (FIG. 3A) has a magnitude greater than DCDITHER. If the magnitude of the output of decimation filter 8 during calibration interval 25 is less than the threshold level code DZERO, i.e, if the digital output of decimation filter 8 is within the region 19 in FIG. 3A, then dither controller 10 produces a value of DCON so as to connect conductor 6 to $+V_{DCDITHER}$ if the output 9 of decimation filter 8 is positive, or to $-V_{DCDITHER}$ if the output of decimation filter 8 is negative.

Figure 3B:
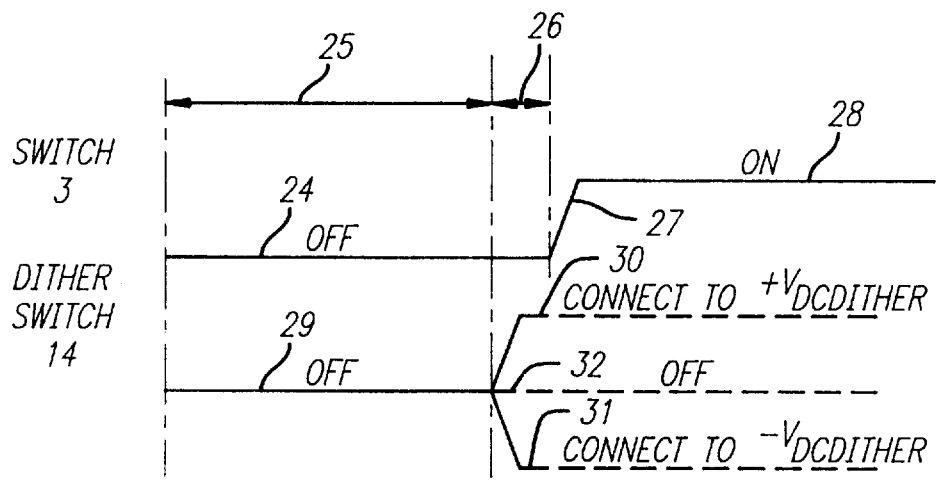
FIG. 3B is a timing diagram useful in explaining the operation of the analog-to-digital converter of FIG. 1.

The dither switch control signal timing diagram is shown in FIG. 3B, wherein during a calibration interval indicated by arrows 25, initialization switch 3 is off, as indicated by reference numeral 24. At the same time, dither switch 14 also is off, as indicated by reference numeral 29. Then, if the magnitude of the output DZERO of decimation filter 8 is less than the magnitude of REF while input conductor 2A is coupled to ground, dither switch 14 connects DC dither signal conductor 6 to either $+V_{DCDITHER}$ or $-V_{DCDITHER}$ at the end of the interval 25 in FIG. 3B, depending on whether the decimation filter output is positive or negative. If DZERO is positive and its magnitude value is less than DCDITHER, dither switch 14 sets the dither signal on conductor 13 to $+V_{DCDITHER}$, which have a value with the magnitude of the digital offset number DCDITHER. If DZERO is negative, and its magnitude is less than the digital offset number DCDITHER, dither switch 14 connects conductor 6 to the DC level $-V_{DCDITHER}$ volts.

Since the dither signal on conductor 6 is a DC signal, it is eliminated by the high pass filter included in block 11 and therefore has no effect on the digital output produced on conductor 12.

Figure 5:
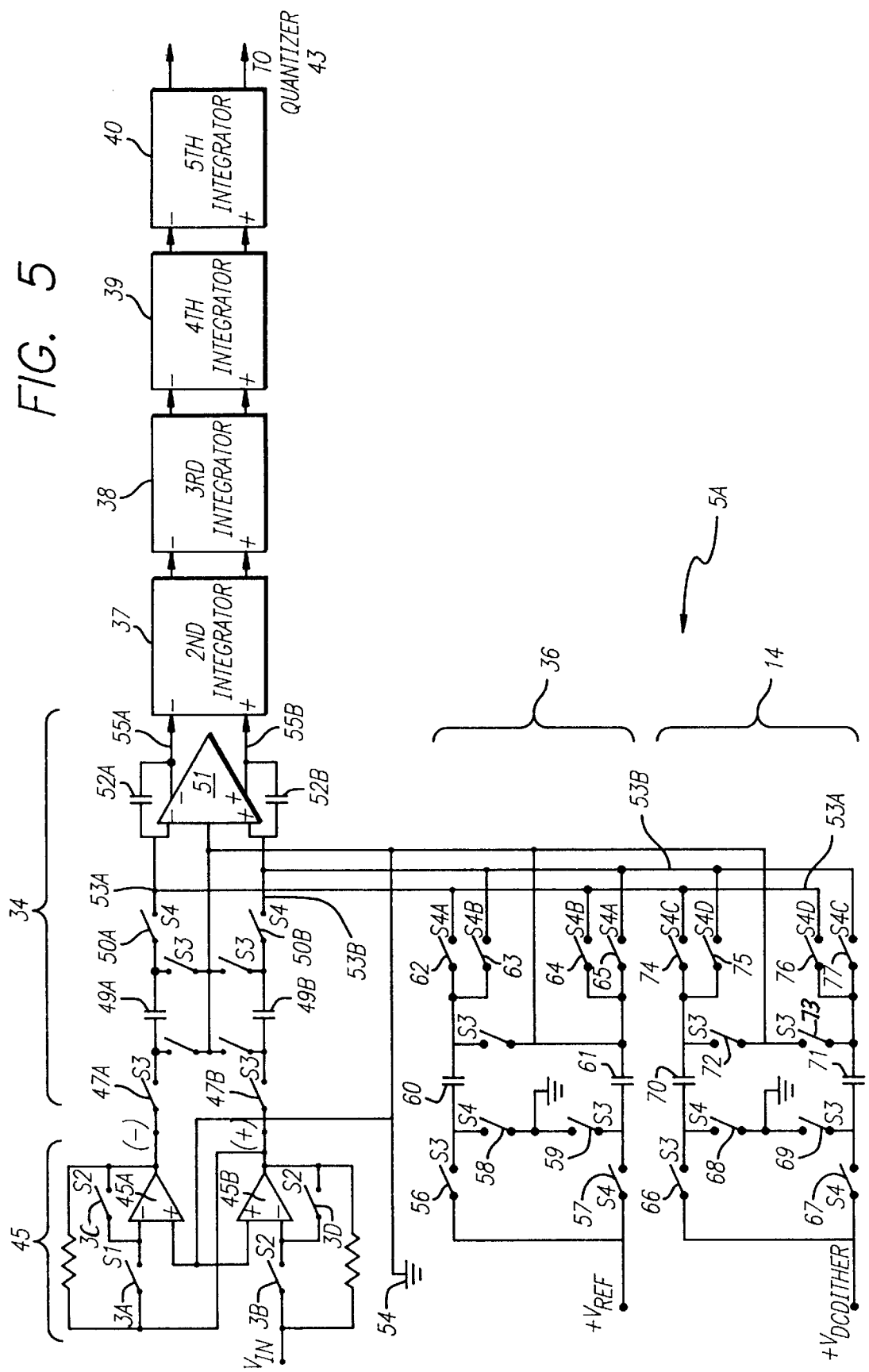
FIG. 5 is a schematic diagram of the fifth-order delta-sigma modulator of FIG. 4.
Figure 6:
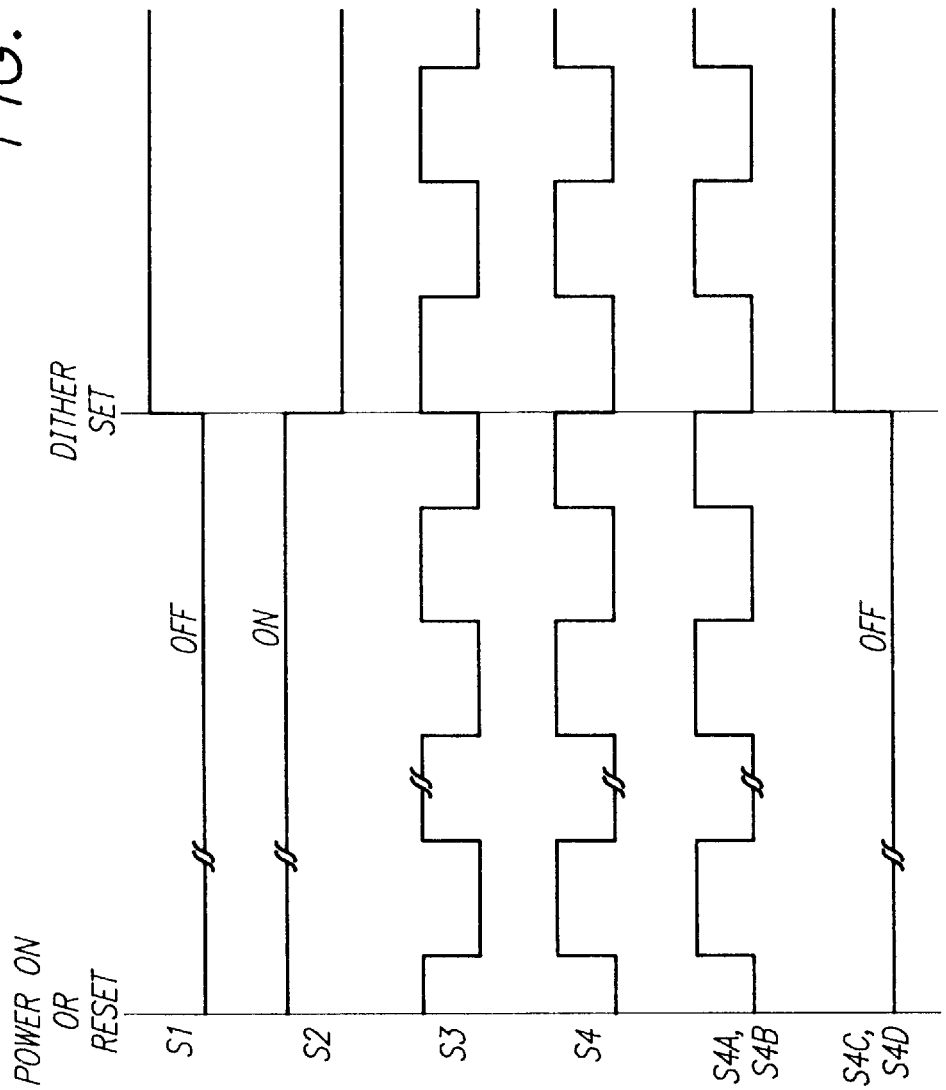
FIG. 6 is a timing diagram useful in describing the operation of the fifth-order delta-sigma modulator of FIG. 2.

FIG. 5 shows the main details of the circuitry 5A including single-ended-to-differential input buffer 45 to delta-sigma modulator 5 and the first integrator 34 thereof. The four additional integrators 37, 38, 39, and 40 are identical to integrator 34. FIG. 5 also shows the single bit feedback DAC 36 and the dither switch circuit 14; however, for convenience the quantizer 43 (FIG. 4) which generates the feedback signals S4A and S4B that control one-bit feedback DAC 36 is omitted in FIG. 5. FIG. 6 shows a timing diagram of the control signals for the various switches shown in FIG. 5. Note that the signal (e.g., 51, 52, etc.) controlling each switch in FIG. 5 is indicated adjacent thereto.

Input buffer 45 includes two operational amplifiers 45A and 45B connected as unity gain buffers when switches 3C and 3D are closed to apply a differential voltage representing analog input voltage $V_{in}$ between the (+) and (−) inputs of integrator 34. Integrator 34 includes a differential input, differential output integrating amplifier 51 having two integrating capacitors 52A and 52B as shown. Operational amplifiers 45A, 45B, and 51 all have inherent manufacturing offset voltages which together result in the above mentioned composite offset voltage represented by the digital offset voltage code DZERO.

Switch 3B couples $V_{in}$ to the inverting input of operational amplifier 45B, the (+) input of which is connected to ground. The output of operational amplifier 45B is coupled by switch 47B to the (+) input of integrator 34 and is coupled by switch 3A to the (−) input of operational amplifier 45A. The output of operation amplifier 45A is coupled by switch 47A to the (−) input of integrator 34. Input buffer 45 therefore applies the single-ended input $V_{in}$ as a differential voltage between the (+) and (−) inputs of first integrator 34 of fifth-order delta-sigma modulator 5.

The capacitive switching circuitry of integrators 34 is conventional and operates to sample the differential input voltage $V_{in}$ onto sampling capacitors 49A and 49B during the sampling operation and then apply the sampled voltages to the (+) and (−) inputs of amplifier 51 during the integration operation.

Feedback DAC 36 also is conventional, with the capacitive switching circuit sampling the feedback reference voltage $V_{REF1}$ onto capacitors 60 and 61 and then applying the sampled feedback reference voltages to the (+) and (−) inputs of amplifier 51 or vice versa so as to increase or decrease the amount of charge integrated, depending upon the decision of comparator or quantizer 43 (FIG. 4), as is conventional in delta-sigma modulators.

Dither switch circuit 14 includes capacitive switching circuitry that operates switches 66, 67, 72 and 73 to sample the dither reference voltage $+V_{DCDITHER}$ onto sampling capacitors 70 and 71. After dither controller 10 makes its decision (i.e., after the time indicated "dither set" in FIG. 6), the switches controlled by S1 (FIG. 6) are on and the switches controlled by S2 are off. If the dither controller decision (based on the value of the offset code DZERO as indicated in FIG. 3A) is "$+V_{DCDITHER}$", the switches controlled by S4C are on; in this case the voltage $+V_{DCDITHER}$ is applied between conductor 53B and conductor 53A. If the dither controller decision is "$-V_{DCDITHER}$", the switches controlled by S4D are on, and $-V_{DCDITHER}$ is applied between conductor 53B and conductor 53A. If the dither controller decision is "OFF", the switches controlled by signals S4C and S4D remain off, and no DC dither signal is applied to operational amplifier 51 during integration because the composite offset voltage is large enough to shift the characteristic tone out of the audible pass band without a DC dither signal being applied to integrator amplifier 51.

The above described embodiment of the invention has been constructed and tested, and has been found to eliminate a characteristic tone of roughly 2 kilohertz and amplitude of roughly −100 dB from the audible pass band. The additional circuitry and chip area required is quite small, and the additional power is substantially less than would be required if prior AC or DC dither frequencies had been used.

Those skilled in the art will appreciate that in order to accomplish the same shifting of the characteristic tone out of the audible pass band using a square wave AC dither signal instead of the foregoing DC dither signal, the required dither signal amplitude would be roughly five times the amplitude of the $\pm V_{DCDITHER}$ levels of the present invention and that such large AC dither signal amplitude would deteriorate the maximum analog input signal range and thus the dynamic range of the delta-sigma analog-to-digital converter. Additional analog circuitry would be required to compensate for such deterioration in dynamic range.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A delta-sigma analog-to-digital converter comprising in combination:

(a) a delta-sigma modulator having an analog input adapted to receive an analog input signal and a dither input adapted to receive a dither signal and producing in response thereto a first stream of digital pulses;

(b) a decimation filter having an input receiving the first stream of digital pulses and producing in response thereto a second stream of digital pulses;

(c) an initialization switch circuit operative in response to an initialization signal to couple the analog input to a first reference voltage, the delta-sigma modulator and the decimation filter being operable while the initialization switch is closed to produce in the second stream of digital pulses a digital offset code representing a total offset voltage associated with the delta-sigma modulator; and (d) dither circuitry for reducing effects of a characteristic tone in a delta-sigma analog-to-digital converter without diminishing dynamic range or signal-to-noise ratio thereof, the dither circuitry applying a DC dither voltage to the dither input in response to the digital offset code, the DC dither voltage having a polarity opposite to a polarity of the total offset voltage.

2. The delta-sigma analog-to-digital converter of claim 1 wherein the dither switch circuit decouples the dither input from any dither voltage source if the magnitude of the digital offset code is greater than a predetermined value which indicates that the total offset voltage alone is great enough to shift the characteristic tone out of an audible pass band.

3. A method of minimizing effects of a characteristic tone in a delta-sigma analog-to-digital converter without diminishing dynamic range or signal-to-noise ratio thereof, the delta-sigma analog-to-digital converter including a delta-sigma modulator having an analog input adapted to receive an analog input signal and a dither input adapted to receive a dither signal and producing a stream of data pulses in response thereto, the data pulses being applied to an input of a decimation filter, the method comprising the steps of:

(a) coupling the analog input of the delta-sigma modulator to a first reference voltage and also coupling the dither input of the delta-sigma modulator to the first reference voltage;

(b) operating the delta-sigma modulator and the decimation filter to produce a digital offset code representing a total offset voltage associated with the delta-sigma modulator;

(c) causing the dither signal to be equal to
      1. a first DC voltage if the digital offset code is positive with respect to the first reference voltage and is of a magnitude less than a predetermined magnitude, or
      2. a second DC voltage if the digital offset code is negative with respect to the first reference voltage and is of a magnitude less than the predetermined magnitude; or (d) decoupling the dither input from any dither voltage if the magnitude of the digital offset code is greater than the predetermined magnitude; and (e) coupling the analog input of the delta-sigma modulator to an analog input voltage and operating the delta-sigma analog-to-digital converter to produce a corresponding digital output signal.

4. The method of claim 3 wherein the predetermined magnitude is a minimum magnitude of the dither signal required to shift the characteristic tone out of an audible pass band of the delta-sigma modulator.

5. The method of claim 3 wherein the delta-sigma modulator is a fifth order delta-sigma modulator, the method including performing a high pass filtering of a digital output signal produced by the decimation filter to remove the effects of DC components of the analog input signal from the digital output signal.

6. The method of claim 3 wherein step (b) includes coupling the analog input to a ground reference voltage to apply a zero analog voltage to the analog input during the operating of the delta-sigma modulator and the decimation filter.

7. In a delta-sigma analog-to-digital converter, the delta-sigma analog-to-digital converter including a delta-sigma modulator having an analog input adapted to receive an analog input signal and a dither input adapted to receive a dither signal, and producing a stream of digital pulses applied to an input of a decimation filter, dither circuitry for minimizing effects of a characteristic tone of the delta-sigma analog-to-digital converter without diminishing dynamic range or signal-to-noise ratio thereof, the dither circuitry comprising in combination:

(a) an initialization switch circuit operative in response to an initialization signal to couple the analog input to a first reference voltage;

(b) a dither switch circuit operative in response to a dither control signal to couple a dither input of the delta-sigma modulator to a selected DC dither voltage or to decouple the dither input from any dither voltage;

(c) the delta-sigma modulator and the decimation filter being operable while the initialization switch is closed to produce a digital offset code representing a total offset voltage associated with the delta-sigma modulator;

(d) a dither control circuit receiving the digital offset code and operative to compare the digital offset code to a number DCDITHER representative of a predetermined threshold voltage and producing the dither control signal to operate the dither control circuit to produce on the dither input a dither signal equal to
 1. a first DC voltage if the digital offset code is positive with respect to the first reference voltage and is of a magnitude less than the number, or
 2. a second DC voltage if the digital offset code is negative with respect to the first reference voltage and is of a magnitude less than the number,
 3. the dither control circuit causing the dither input to be uncoupled to any dither voltage source if the magnitude of the digital offset code is greater than the number.

8. A delta-sigma analog-to-digital converter comprising in combination:

(a) a delta-sigma modulator having an analog input adapted to receive an analog input signal and a dither input adapted to receive a dither signal and producing in response thereto a first stream of digital pulses;

(b) a decimation filter having an input receiving the first stream of digital pulses and producing in response thereto a second stream of digital pulses;

(c) an initialization switch circuit operative in response to an initialization signal to couple the analog input to a first reference voltage; and (d) dither circuitry for reducing effects of a characteristic tone in a delta-sigma analog-to-digital converter without diminishing dynamic range or signal-to-noise ratio thereof, the dither circuitry including
 i. a dither switch circuit operative in response to a dither control signal to couple a dither input of the delta-sigma modulator to a selected DC dither voltage or to decouple the dither input from any dither voltage, the delta-sigma modulator and the decimation filter being operable while the initialization switch is closed to produce in the second stream of digital pulses a digital offset code representing a total offset voltage associated with the delta-sigma modulator, and
 ii. a dither control circuit receiving the digital offset code and operative to compare the digital offset code to a number representative of a predetermined threshold voltage and producing the dither control signal to operate the dither control circuit to produce on the dither input a dither signal equal to (1) a first DC voltage if the digital offset code is positive with respect to the first reference voltage and is of a magnitude less than the number, or (2) a second DC voltage if the digital offset code is negative with respect to the first reference voltage and is of a magnitude less than the number, the dither control circuit causing the dither input to be uncoupled to any dither voltage source if the magnitude of the digital offset code is greater than the number.

9. The delta-sigma analog-to-digital converter of claim 8 wherein the number is a minimum magnitude of the dither signal required to shift the characteristic tone out of an audible pass band.

10. The delta-sigma analog-to-digital converter of claim 8 wherein the delta-sigma modulator is a fifth-order delta-sigma modulator.

11. The delta-sigma analog-to-digital converter of claim 8 wherein the dither control circuit includes a digital comparator having an input coupled to receive the digital offset code and is operative to produce the control signal indicative of the polarity of the digital offset code and whether its magnitude exceeds the number.

12. The delta-sigma analog-to-digital converter of claim 8 including a high pass filter receiving the second stream of digital pulses to remove DC components of the analog input signal.

* * * * *